US012566229B2

(12) United States Patent
Siegel et al.

(10) Patent No.: US 12,566,229 B2
(45) Date of Patent: Mar. 3, 2026

(54) METHODS AND APPARATUS FOR MEDICAL IMAGING EVENT DETECTION TIMING CORRECTIONS AND IMAGE RECONSTRUCTION

(71) Applicant: Siemens Medical Solutions USA, Inc., Malvern, PA (US)

(72) Inventors: Stefan Siegel, Knoxville, TN (US); Ziad Burbar, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 282 days.

(21) Appl. No.: 18/584,193

(22) Filed: Feb. 22, 2024

(65) Prior Publication Data

US 2025/0271521 A1 Aug. 28, 2025

(51) Int. Cl.
*G01R 33/54* (2006.01)
*G01R 33/48* (2006.01)
*H03M 1/50* (2006.01)

(52) U.S. Cl.
CPC ......... *G01R 33/543* (2013.01); *G01R 33/481* (2013.01); *H03M 1/50* (2013.01)

(58) Field of Classification Search
CPC ...... G01R 33/48; G01R 33/54; G01R 33/543; G01R 33/481; H03M 1/50
See application file for complete search history.

(56) References Cited

U.S. PATENT DOCUMENTS

| | | | | |
|---|---|---|---|---|
| 9,140,804 | B2 * | 9/2015 | Kim | G01T 1/1644 |
| 12,148,070 | B2 * | 11/2024 | Song | G01T 1/171 |
| 12,399,286 | B2 * | 8/2025 | Qiang | G01T 1/15 |
| 2013/0214168 | A1 * | 8/2013 | McDaniel | G01T 1/2985 250/362 |
| 2019/0150877 | A1 * | 5/2019 | Sun | G01T 1/2985 |
| 2019/0353808 | A1 * | 11/2019 | Watanabe | G01T 1/2985 |
| 2022/0381928 | A1 * | 12/2022 | Kawata | G01T 1/242 |

* cited by examiner

*Primary Examiner* — Jurie Yun

(57) ABSTRACT

Systems and methods for correcting timing information associated with captured nuclear imaging data, and for reconstructing medical images based on the corrected timing information, are disclosed. In some embodiments, an image scanning system scans a subject, detects an event, and generates timing data for the detected event. The timing data includes a first number of bits, and characterizes a time that a crystal of the image scanning system detected the event. The image scanning system shifts the first number of bits by a predetermined amount to generate a second number of bits, where the second number of bits includes at least one bit representing a lower order time value than the least significant bit of the first number of bits of the timing data. Further, the image scanning system generates timing correction data for the event based on the second timing data.

20 Claims, 8 Drawing Sheets

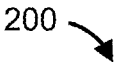
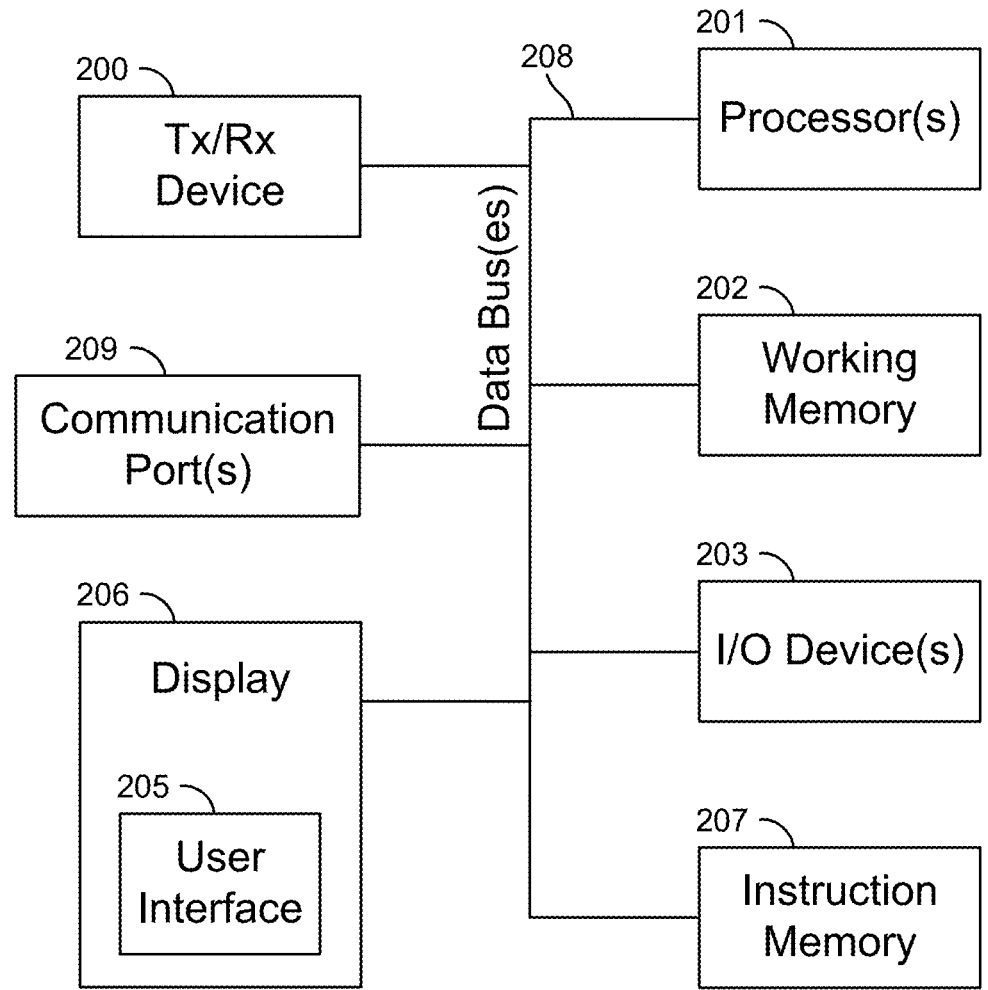
FIG. 2

400

START

RECEIVE PET TIMING DATA FOR A PET CRYSTAL DETECTION ⌐402

SHIFT THE PET TIMING DATA BY A PREDETERMINED AMOUNT ⌐404

GENERATE PET TIMING CORRECTION DATA FOR THE PET CRYSTAL DETECTION BASED ON THE SHIFTED PET TIMING DATA ⌐406

TRANSMIT THE PET TIMING CORRECTION DATA ⌐408

END

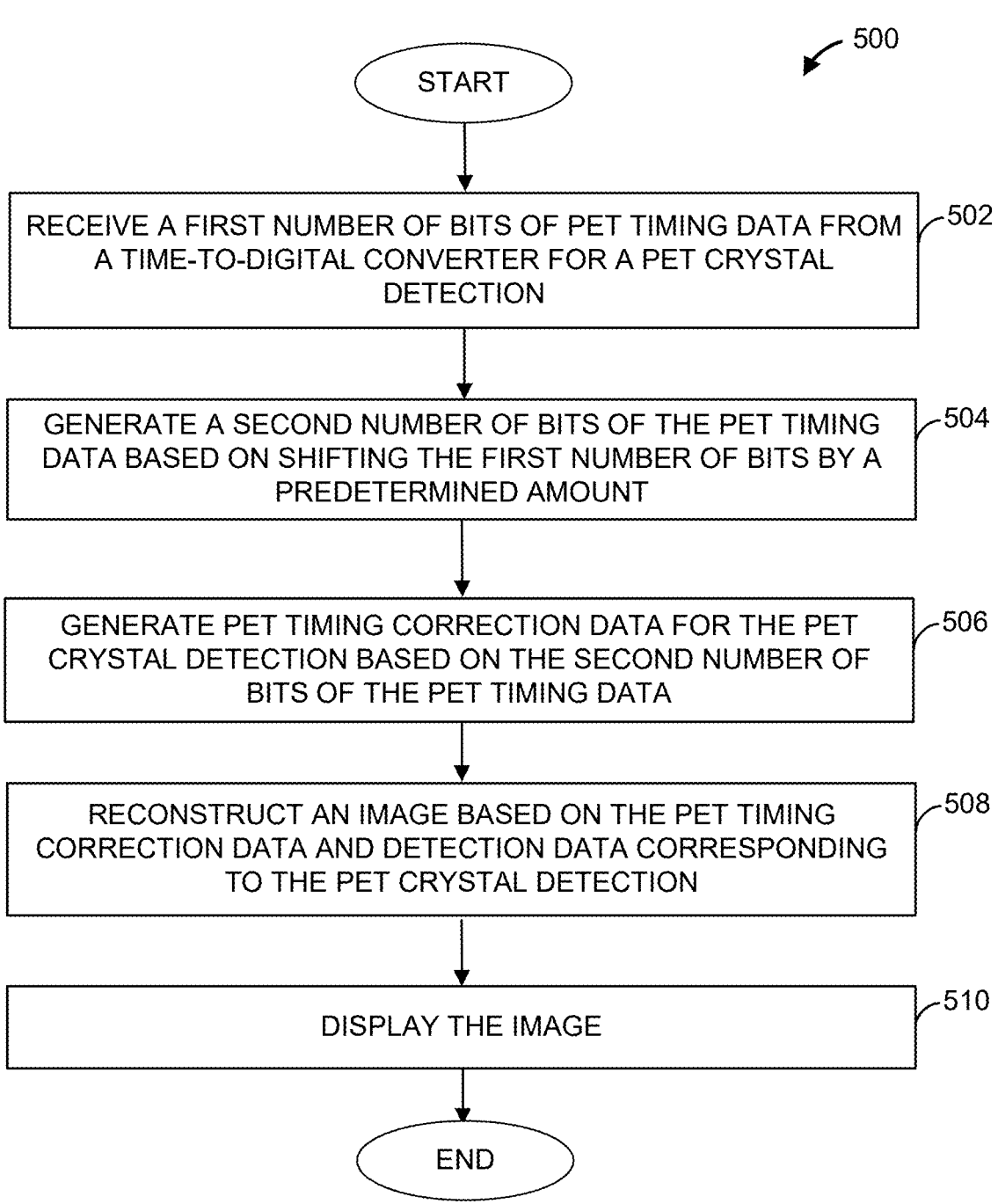

500

START

RECEIVE A FIRST NUMBER OF BITS OF PET TIMING DATA FROM A TIME-TO-DIGITAL CONVERTER FOR A PET CRYSTAL DETECTION ⌐502

GENERATE A SECOND NUMBER OF BITS OF THE PET TIMING DATA BASED ON SHIFTING THE FIRST NUMBER OF BITS BY A PREDETERMINED AMOUNT ⌐504

GENERATE PET TIMING CORRECTION DATA FOR THE PET CRYSTAL DETECTION BASED ON THE SECOND NUMBER OF BITS OF THE PET TIMING DATA ⌐506

RECONSTRUCT AN IMAGE BASED ON THE PET TIMING CORRECTION DATA AND DETECTION DATA CORRESPONDING TO THE PET CRYSTAL DETECTION ⌐508

DISPLAY THE IMAGE ⌐510

END

FIG. 5

METHODS AND APPARATUS FOR MEDICAL IMAGING EVENT DETECTION TIMING CORRECTIONS AND IMAGE RECONSTRUCTION

FIELD

Aspects of the present disclosure relate in general to medical diagnostic systems and, more particularly, to capturing and reconstructing images from nuclear imaging systems for diagnostic and reporting purposes.

BACKGROUND

Nuclear imaging systems can employ various technologies to capture images. For example, some nuclear imaging systems employ positron emission tomography (PET) to capture images. PET is a nuclear medicine imaging technique that produces tomographic images representing the distribution of positron emitting isotopes within a body. Some nuclear imaging systems combine images from PET and a co-modality, such as computed tomography (CT) or Magnetic Resonance Imaging (MRI). CT is an imaging technique that uses x-rays to produce anatomical images. Magnetic Resonance Imaging (MRI) is an imaging technique that uses magnetic fields and radio waves to generate anatomical and functional images, and may also be used as a co-modality. These nuclear imaging systems can combine images from PET and co-modality scanners during an image fusion process to produce images that show information from both the PET scan and the co-modality scan (e.g., PET/CT systems). Moreover, the nuclear imaging systems may generate an attenuation map that can be used to correct the PET measurement data during image reconstruction.

Typically, PET systems (e.g., time-of-flight (TOF) PET systems) include a scanner with detector elements that detect gamma rays during the scanning process. The detector elements include crystals that detect the gamma rays. When a detection is made, the PET systems generate timing information for the detection. For various reasons, the timing information assigned to a detection may not be accurate. For example, mechanical limitations, such as signal propagation delays caused by cables and board layout, may cause inaccurate timing information to be assigned to detections. Although some PET systems attempt to correct the timing information, the correction applied is often lacking, thereby reducing the accuracy of reconstructed images. As such, there are opportunities to address these and other deficiencies in nuclear imaging systems.

SUMMARY

Systems and methods for correcting timing information associated with captured nuclear imaging data, and for reconstructing medical images based on the corrected timing information, are disclosed.

In some embodiments, a computer-implemented method includes receiving first timing data for a nuclear imaging scanner event detection, the first timing data comprising a first number of bits. The method also includes generating second timing data based on the first timing data, the second timing data comprising a second number of bits, wherein the second number of bits is greater than the first number of bits. Further, the method includes generating timing correction data for the nuclear imaging scanner event detection based on the second timing data. The method also includes storing the timing correction data within a memory device.

In some embodiments, a non-transitory computer readable medium stores instructions that, when executed by at least one processor, cause the at least one processor to perform operations including includes receiving first timing data for a nuclear imaging scanner event detection, the first timing data comprising a first number of bits. The operations also include generating second timing data based on the first timing data, the second timing data comprising a second number of bits, wherein the second number of bits is greater than the first number of bits. Further, the operations include generating timing correction data for the nuclear imaging scanner event detection based on the second timing data. The operations also include storing the timing correction data within a memory device.

In some embodiments, a system includes a data repository and at least one processor communicatively coupled the data repository. The at least one processor is configured to receive first timing data for a nuclear imaging scanner event detection, the first timing data comprising a first number of bits. The at least one processor is also configured to generate second timing data based on the first timing data, the second timing data comprising a second number of bits, wherein the second number of bits is greater than the first number of bits. Further, the at least one processor is configured to generate timing correction data for the nuclear imaging scanner event detection based on the second timing data. The at least one processor is also configured to store the timing correction data within a memory device.

BRIEF DESCRIPTION OF THE DRAWINGS

The following will be apparent from elements of the figures, which are provided for illustrative purposes and are not necessarily drawn to scale.

FIG. 2 illustrates a block diagram of an example computing device that can perform one or more of the functions described herein, in accordance with some embodiments.

FIG. 5 is a flowchart of an example method to reconstruct an image based on timing correction data, in accordance with some embodiments.

DETAILED DESCRIPTION

This description of the exemplary embodiments is intended to be read in connection with the accompanying drawings, which are to be considered part of the entire written description. Independent of the grammatical term usage, individuals with male, female, or other gender identities are included within the term.

The exemplary embodiments are described with respect to the claimed systems as well as with respect to the claimed methods. Furthermore, the exemplary embodiments are described with respect to methods and systems for image reconstruction, as well as with respect to methods and systems for training functions used for image reconstruction. Features, advantages, or alternative embodiments herein can be assigned to the other claimed objects and vice versa. For example, claims for the providing systems can be improved with features described or claimed in the context of the methods, and vice versa. In addition, the functional features of described or claimed methods are embodied by objective units of a providing system. Similarly, claims for methods and systems for training image reconstruction functions can be improved with features described or claimed in context of the methods and systems for image reconstruction, and vice versa.

Various embodiments of the present disclosure can employ machine learning methods or processes to provide clinical information from nuclear imaging systems. For example, the embodiments can employ machine learning methods or processes to reconstruct images based on captured measurement data, and provide the reconstructed images for clinical diagnosis. In some embodiments, machine learning methods or processes are trained, to improve the reconstruction of images.

Figure 6:
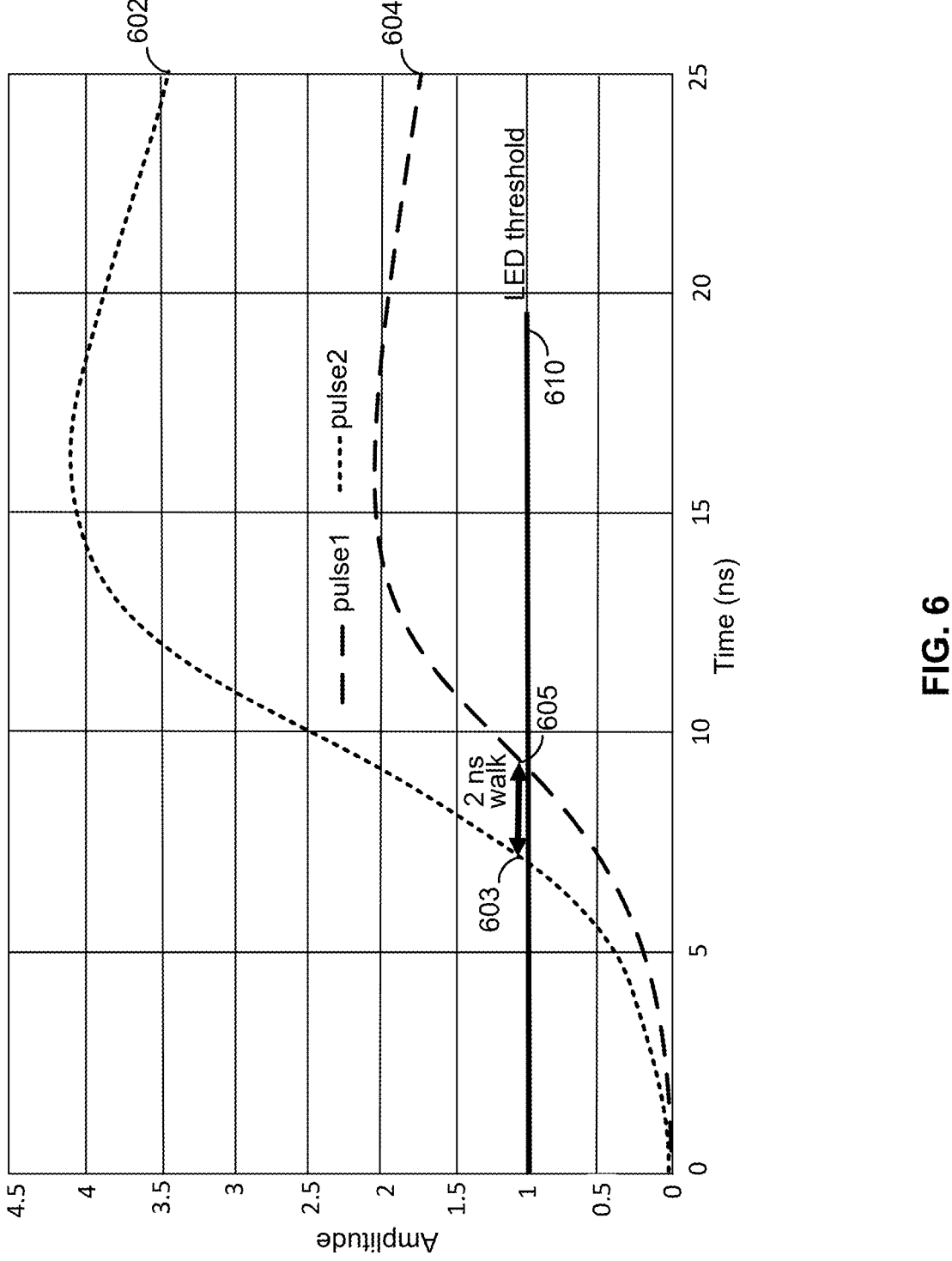
FIG. 6 illustrates the detection of crystal pulses, in accordance with some embodiments.

Positron emission tomography (PET) imaging systems can include a scanner with various detection elements. Each detection element may house crystals that detect emitted gamma rays from a scanned subject. When a crystal detects an event, the PET imaging system assigns a time (e.g., a timestamp) to the detected event. For example, a time-to-digital converter (TDC) of the PET imaging system may provide the time based on when the event was detected. The time provided by the TDC is of a fixed length, such as 16 bits. For example, the least significant bit of a time provided by the TDC may be 62 pico-seconds. Further, and as described herein, the TDC time for a detected event may be corrected. The TDC time may need to be corrected due to timing skew caused by detection hardware. For instance, conventional tomographs sometimes use constant fraction discriminators or leading edge discriminators which can cause skew due to pulse amplitude triggering. FIG. 6, for example, illustrates that two detection pulses 602, 604 which start at a same time (i.e., time 0) that may nonetheless be detected at two various times. As illustrated, pulses may be detected when their amplitude reaches a threshold amplitude level 610. In this example, first pulse 602 reaches the threshold amplitude level 610 at a first time 603, while the second pulse 604 reaches the threshold amplitude level 610 at a second time 605. As such, the second pulse 604 is detected about 2 nano-seconds after the first pulse 602 is detected (e.g., illustrated as a 2 non-second walk between the first pulse 602 and the second pulse 604), even though both detection pulses 602, 604 started at the same time. This timing discrepancy may be due to the differing rise times of the individual pulses and other delay characteristics of a particular imaging system.

Time alignment is a correction process that accounts for the variation in propagation delay of the time signals assigned to each detector element to form a time-coincident data pair. In other words, because each detector element may have corresponding propagation delays, time alignment attempts to correct the TDC time for each reported event based on the detector element corresponding to the detection. Conventional PET systems attempt to correct the TDC time to the nearest least significant bit (LSB) of the TDC time. For example, assuming the LSB of the TDC time represents 62 pico-seconds, conventional PET systems may only adjust the TDC time for a particular detection by a multiple of 62 pico-seconds (e.g., add 62 pico-seconds, subtract 62 pico-seconds, add 124 pico-seconds, subtract 124 pico-seconds, etc.). However, the actual propagation delays and other timing delays in reporting a detection by a particular detector element may not add up to be exactly a multiple of the LSB of the TDC time. For example, the total propagation delay for a particular detector element may be 100 pico-seconds, which falls between 62 and 124 pico-seconds.

To allow imaging systems to account for these timing delays, the examples described herein may introduce a number of lower order bits that allow for a more precise timing correction. For example, as described herein, a TDC time of a particular number of bits, such as 16 bits, may be shifted (e.g., shifted left) by a predetermined amount, such as by 2 bits, to generate an updated TDC time with lower order bits. For example, while the upper bits (e.g., upper 16 bits) of the updated TDC time (e.g., a total of 18 bits) represent the original TDC time, the lower order bits (e.g., lower 2 bits) allow for the TDC time to be adjusted more finely. Indeed, by adding, for example, two additional bits, the lower bit may represent ¼ of the resolution of the lower bit of the original TDC time. For instance, assuming the LSB of the original TDC time represents 62 pico-seconds, the LSB of the updated TDC time may represent 15.5 pico-seconds.

A timing correction may then be applied to the updated TDC time, where the adjustment can represent a lower order of correction than what the LSB of the original TDC time represents. For example, a correction value may be generated based on applying a timing correction model (e.g., algorithm) to the updated TDC time, where the correction value may characterize smaller timing delay corrections than the LSB of the original TDC time. For instance, the timing delay may be or include 31 pico-seconds even though the LSB of the original TDC time represents 62 pico-seconds. The updated TDC time may be computed as the original TDC time minus the timing delay. In some examples, the timing delay for a particular detector element is obtained from a timing delay table stored in memory (e.g., a look-up table).

Further, and based on updated TDC times, measurement data characterizing detections and corresponding timing information (e.g., time between detections) may be generated. For example, rather than computing a time between detections based on original TDC times, the time between detections can be computed based on the updated TDC times for corresponding detections. An image can then be reconstructed based on the measurement data.

Figure 1A:
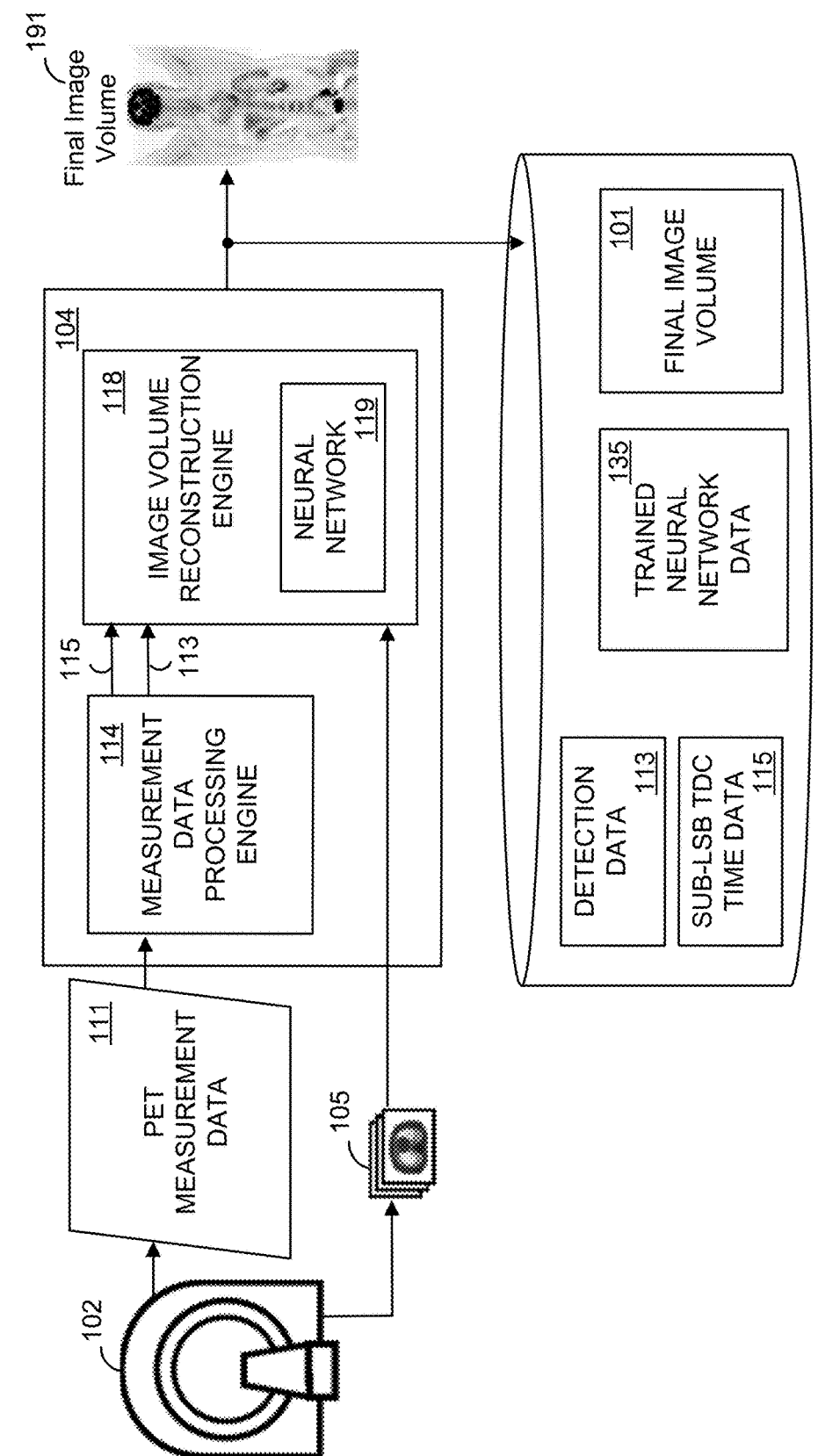
FIGS. 1A, 1B, 1C and 1D illustrate a nuclear imaging system, in accordance with some embodiments.

Referring now to the figures, FIG. 1A illustrates a nuclear imaging system 100 that includes image scanning system 102 and image reconstruction system 104. Image scanning system 102 may be PET scanner that can capture PET images, a PET/MR scanner that can capture PET and MR images, a PET/CT scanner that can capture PET and CT images, or any other suitable image scanner. For example, as illustrated, image scanning system 102 can capture PET images (e.g., of a person), and can generate PET measurement data 111 based on the captured PET images. The PET measurement data 111 (e.g., sinogram data, list-mode data) can represent anything imaged in the scanner's field-of-view (FOV) containing positron emitting isotopes. Moreover, the PET measurement data 111 may identify detection events (e.g., time-coincident pair data) and related timing information. As described herein, the timing information may identify a sub-LSB TDC time of the detection events (e.g., a sub-LSB TDC time between detection events). The image scanning system 102 can transmit the PET measurement data 111 to the image reconstruction system 104.

In some examples, image scanning system 102 may additionally generate attenuation maps 105 (e.g., u-maps). For instance, the image scanning system 102 may be a PET/CT scanner that, in addition to PET images, can capture CT scans of the patient. The image scanning system 102 may generate the attenuation maps 105 based on the captured CT images, and may transmit the attenuation maps 105 to the image reconstruction system 104. As another example, the image scanning system 102 may be a PET/MR scanner that, in addition to PET images, can capture MR scans of the patient. The image scanning system 102 may generate the attenuation maps 105 based on the captured MR images, and may transmit the attenuation maps 105 to the image reconstruction system 104.

Figures 1B, 1C:
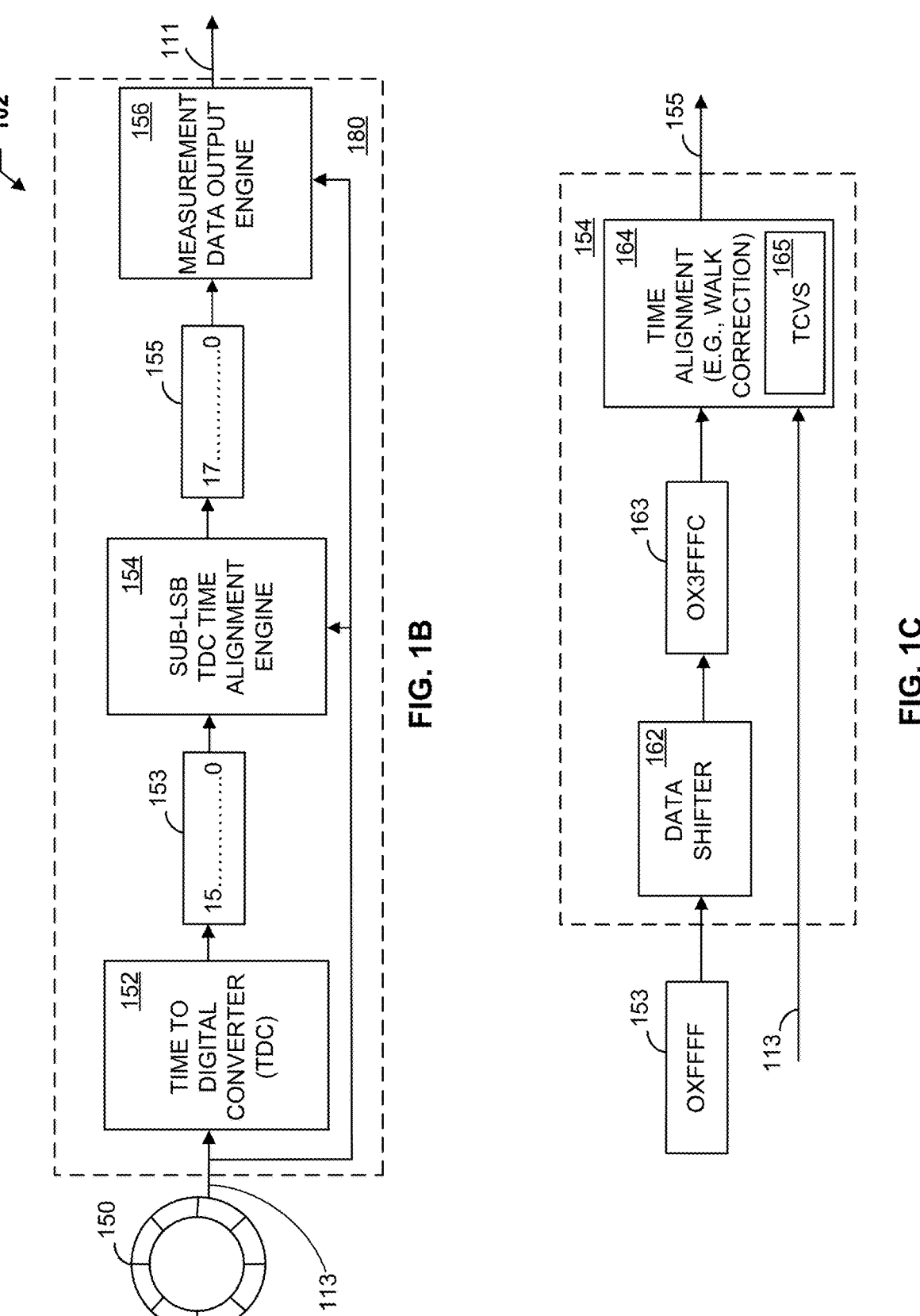

FIG. 1B illustrates an example image scanning system 102 that includes a scanner 150, a time-to-digital converter (TDC) 152, a sub-LSB TDC time alignment engine 154, and a measurement data output engine 156. In some examples, all or parts of image scanning system 102 are implemented in hardware, such as in one or more field-programmable gate arrays (FPGAs), one or more application-specific integrated circuits (ASICs), one or more state machines, one or more computing devices, digital circuitry, or any other suitable circuitry. For example, TDC 152 and sub-LSB TDC time alignment engine 154 may be implemented within an FPGA 180. In some examples, parts or all of image scanning system 102 can be implemented in software as executable instructions such that, when executed by one or more processors, cause the one or more processors to perform respective functions as described herein. The instructions can be stored in a non-transitory, computer-readable storage medium, and can be read and executed by the one or more processors.

As illustrated, scanner 150 can scan a subject and generate detection data 113 identifying pulse detections (e.g., by leading edge discriminators of the scanner 150). TDC 152 may receive the detection data 113, and generate, for each pulse detection, a TDC digital time 153. For example, TDC 152 may sample a system time and, based on the sampled system time, generate the TDC digital time 153. The TDC digital time 153 may include a predetermined number of bits. For instance, as illustrated, the TDC digital time 153 may include 16 bits. The least-significant-bit (LSB) of the TDC digital time 153 may correspond to a minimum time, such as 62 pico-seconds.

Further, sub-LSB TDC time alignment engine 154 may receive the TDC digital time 153 from the TDC 152, and may generate a sub-LSB TDC corrected time 155 based on applying a correction process to the received TDC digital time 153. The sub-LSB TDC corrected time 155 may include a greater number of bits than the TDC digital time 153. For instance, as illustrated, the sub-LSB TDC corrected time 155 may include 18 bits, whereas the TDC digital time 153 may have included 16 bits. To generate the sub-LSB TDC corrected time 155, sub-LSB TDC time alignment engine 154 may apply a shifting process to the received TDC digital time 153, and may then apply a corresponding timing correction to the shifted TDC digital time.

For instance, FIG. 1C illustrates an example of sub-LSB TDC time alignment engine 154. Sub-LSB TDC time alignment engine 154 may input the TDC digital time 153 to a data shifter 162 that applies a shifting process to the TDC digital time 153 to shift the corresponding timing data by a predetermined number of bits, and generates shifted time 163. For instance, data shifter 162 may receive a TDC digital time 153 with a 16 bit value of 0xFFFF, and may shift the 0xFFFF value left by two bits to generate an 18 bit value of 0x3FFFC. The lower two bits of the newly generated 18 bit value may be zero. As described herein, the lower two bits may represent sub-LSB times. Thus, the 16 bit value of 0xFFFF may be equivalent to the 18 bit value of 0x3FFFC (e.g., the upper 16 bits represent the original TDC digital time 153 of 0xFFFF, and the lower 2 bits, which represent sub-LSB times, are zero).

Figure 1D:
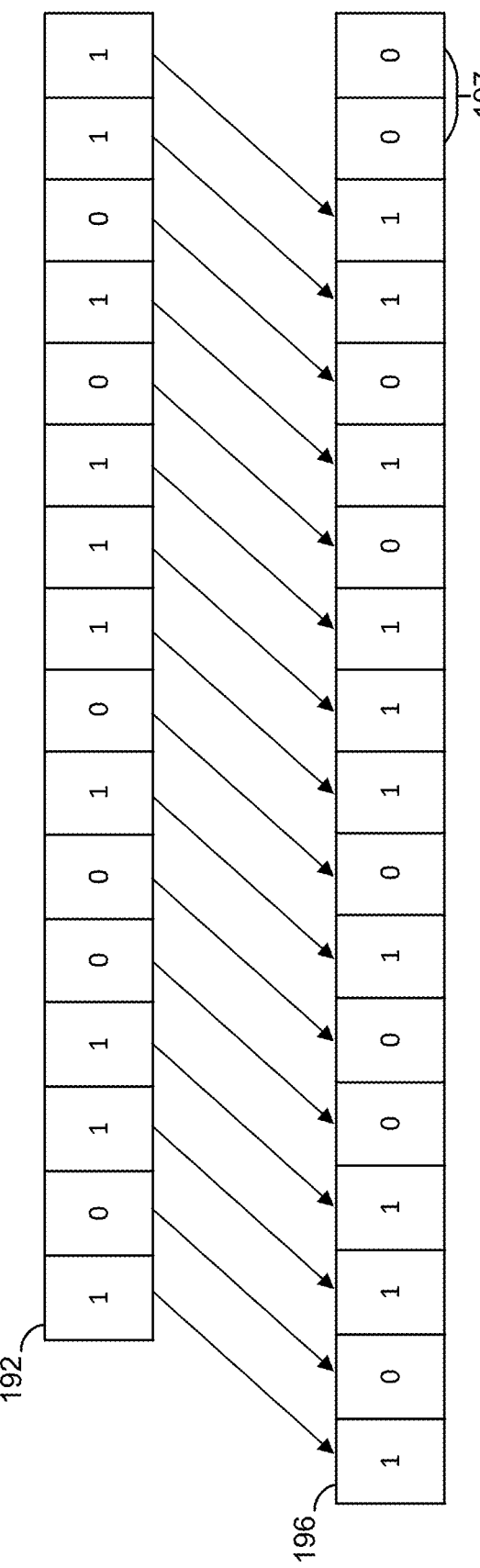

As an example, to generate the shifted time 163, data shifter 162 may store the TDC digital time 153 in memory (e.g., an internal memory, such as a RAM memory), and may apply the shifting process to the stored TDC digital time 153 to shift the stored TDC digital time 153 by a predetermined number of bits (e.g., 2 bits) to generate the shifted time 163. FIG. 1D, for example, illustrates a 16 bit value corresponding to a TDC digital time 153 that is stored within a first register 192. The 16 bit value is then shifted left by two bits and stored in a second register 196. The second register 196 includes two lower bits 197 that are written with zeros, and represent sub-LSB TDC timing correction values.

Referring back to FIG. 1C, time alignment 164 may receive the shifted time 163, and may apply a timing correction process to the shifted time 163 to generate sub-LSB TDC corrected time 155. The timing correction process may, for instance, include sub-LSB TDC timing corrections (e.g., timing corrections to a granularity of less than the value of the LSB of the TDC digital time 153). As an example, time alignment 164 may determine, e.g., based on an algorithm or look-up table, a timing correction to apply to the shifted time 163. The time correction may be a timing correction value corresponding to the crystal and/or detection element identified by the detection data 113. For instance, time alignment 164 may determine a crystal identified by the detection data 113, and may retrieve the timing correction value for the crystal from a plurality of timing correction values (TCVS) 165 stored in an internal memory (e.g., a EEPROM device) of time alignment 164. The timing correction values may include times that are of a finer resolution than the corresponding time value pertaining to the LSB of the TDC digital time 153. For example, if the shifting process applied at block 504 corresponds to a two bit shift, then the timing corrections can include values corresponding to ¼ of the corresponding time value pertaining to the LSB of the TDC digital time 153. Thus, if the LSB of the TDC digital time 153 corresponds to 62 pico-seconds, the timing corrections can include multiples of 15.6 pico-seconds (i.e., ¼ of 62 pico-seconds). Further, time alignment 164 may combine (e.g., add) the retrieved timing correction value to the shifted time 163 to generate the sub-LSB TDC corrected time 155.

Among various advantages, the sub-LSB TDC corrected times 155 allow for more accurate corrections to the TDC times by having more precise time alignment values. These more precise corrections can correct for static offsets introduced by cabling, layout, and electronic variations, which may not be expected to change appreciably over the course of a scan, between scans, or even between calibration runs. The sub-LSB TDC corrected time 155 may also provide dynamic timing corrections, such as to minimize discriminator walk. For instance, the sub-LSB TDC corrected times 155 can correct for walk by including timing corrections that may be a function of a pulse amplitude. The finer bits of the sub-LSB TDC corrected times 155 allow for a more accurate walk correction.

Referring back to FIG. 1B, sub-LSB TDC time alignment engine 154 may transmit the sub-LSB TDC corrected time 155 to measurement data output engine 156. Measurement data output engine 156 may also receive the detection data 113 from the scanner 150. Based on the detection data 113 and the sub-LSB TDC corrected time 155, measurement data output engine 156 may generate the PET measurement data 111. The PET measurement data 111 may identify detected events that are determined to be coincident (e.g., time-coincident data pairs). For example, measurement data output engine 156 may receive the detection data 113 and sub-LSB TDC corrected time 155 for a pair of detected events, and may determine the events to be coincident based on the sub-LSB TDC corrected times 155. For example, measurement data output engine 156 may determine the events to be coincident when the sub-LSB TDC corrected times 155 are within a predetermined range (e.g., their difference is less than a threshold time difference). Measurement data output engine 156 may generate the PET measurement data 111 based on these determined time-coincident pairs. The timing corrections offered by the sub-LSB TDC corrected times 155 can reduce errors in the measurement of event time difference, offering a finer resolution of time.

Although the functions of TDC 152, sub-LSB TDC time alignment engine 154. and measurement data output engine 156 are described as being performed by the image scanning system 102, in some examples, one or more other systems and/or devices may perform one or more of any of these functions. For example, in some instances, one or more computing devices (e.g., servers, cloud-based servers, laptops, etc.) may perform one or more of any of the functions of TDC 152, sub-LSB TDC time alignment engine 154, and measurement data output engine 156. For example, the one or more computing devices may receive the detection data 113 from a scanner 150, and may perform any of these functions. In some examples, image reconstruction system 104 may perform one or more of any of the functions of TDC 152, sub-LSB TDC time alignment engine 154, and measurement data output engine 156.

Referring back to FIG. 1A, image reconstruction system 104 receives PET measurement data 11 and, in some examples, a corresponding attenuation map 105 from the image scanning system 102. In some examples, all or parts of image reconstruction system 104 are implemented in hardware, such as in one or more field-programmable gate arrays (FPGAs), one or more application-specific integrated circuits (ASICs), one or more state machines, one or more computing devices, digital circuitry, or any other suitable circuitry. In some examples, parts or all of image reconstruction system 104 can be implemented in software as executable instructions such that, when executed by one or more processors, cause the one or more processors to perform respective functions as described herein. The instructions can be stored in a non-transitory, computer-readable storage medium, and can be read and executed by the one or more processors.

As illustrated, image reconstruction system 104 may include a measurement data processing engine 114 and an image volume reconstruction engine 118. Measurement data processing engine 114 may receive PET measurement data 111 from the image scanning system 102, and may parse PET measurement data 111 to extract detection data 113 characterizing crystal detections, and sub-LSB TDC time data 115 characterizing corresponding detection time values. In some instances, measurement data processing engine 114 stores one or more of detection data 113 and sub-LSB TDC time data 115 within data repository 116. Further, measurement data processing engine 114 may provide the detection data 113 and the sub-LSB TDC time data 115 to the image volume reconstruction engine 118.

Further, image volume reconstruction engine 118 may apply a trained machine learning process to the detection data 113 and the sub-LSB TDC time data 115 to reconstruct an image. For example, image volume reconstruction engine 118 may obtain, from data repository 116, trained neural network data 135 characterizing parameters (e.g., hyperparameters, weights, etc.) of a trained neural network 119. Image volume reconstruction engine 118 may establish the trained neural network 119 based on the trained neural network data 135. Further, and upon establishing the trained neural network 119, image volume reconstruction engine 118 may apply the trained neural network 119 to the detection data 113 and the sub-LSB TDC time data 115 to generate final image volume 191 characterizing the reconstructed image. In some examples, image volume reconstruction engine 118 also receives an attenuation map from the image scanning system 102. Image volume reconstruction engine 118 may apply an attenuation correction process (e.g., an attenuation correction algorithm) to the output of the trained neural network 119 to generate the final image volume 191.

Figure 3:
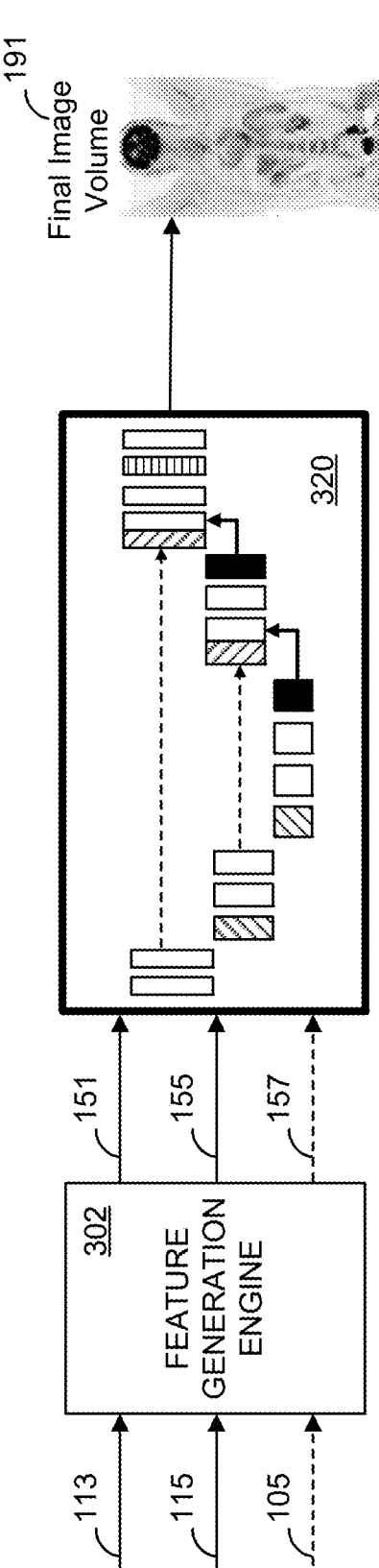
FIG. 3 illustrates a reconstruction of a nuclear image using a neural network, in accordance with some embodiments.

For example, FIG. 3 illustrates exemplary portions of an image volume reconstruction engine 118 that includes a feature generation engine 302 and a trained neural network 320. Image volume reconstruction engine 118 may input the detection data 113 and the sub-LSB TDC time data 115 to the feature generation engine 302. In response, feature generation engine 302 may generate detection features 151 based on the detection data 113, and may generate timing features 155 based on the sub-LSB TDC time data 115. Image volume reconstruction engine 118 inputs the detection features 151 and the timing features 155 to the trained neural network 320. Based on the inputted detection features 151 and timing features 155, the trained neural network 320 may generate the final image volume 191.

In some examples, the feature generation engine 302 receives an attenuation map 105, and generates map features 157 based on the attenuation map 105. Image volume reconstruction engine 118 may input the map features 157 to the trained neural network 320, and the trained neural network 320 may generate the final image volume 191 based on the inputted detection features 151, timing features 155, and map features 157.

Referring back to FIG. 1A, image volume reconstruction engine 118 may transmit the final image volume 191 characterizing the reconstructed image. For instance, image volume reconstruction engine 118 and may transmit the final image volume 191 for display.

FIG. 2 illustrates a computing device 200 that can be employed by any of the image scanning system 102 and the image reconstruction system 104. For instance, computing device 200 can implement one or more of the functions of the image scanning system 102 and/or image reconstruction system 104 described herein.

Computing device 200 can include one or more processors 201, working memory 202, one or more input-output devices 203, instruction memory 207, a transceiver 204, one or more communication ports 209, and a display 206, all operatively coupled to one or more data buses 208. Data buses 208 allow for communication among the various devices. Data buses 208 can include wired, or wireless, communication channels.

Processors 201 can include one or more distinct processors, each having one or more cores. Each of the distinct processors can have the same or different structure. Processors 201 can include one or more central processing units (CPUs), one or more graphics processing units (GPUs), application specific integrated circuits (ASICs), digital signal processors (DSPs), and the like.

Processors 201 can be configured to perform a certain function or operation by executing code, stored on instruction memory 207, embodying the function or operation. For example, processors 201 can be configured to perform one or more of the functions, methods, or operations disclosed herein.

Instruction memory 207 can store instructions that can be accessed (e.g., read) and executed by processors 201. For example, instruction memory 207 can be a non-transitory, computer-readable storage medium such as a read-only memory (ROM), an electrically erasable programmable read-only memory (EEPROM), flash memory, a removable disk, CD-ROM, any non-volatile memory, or any other suitable memory. For example, instruction memory 207 can store instructions that, when executed by one or more processors 201, cause one or more processors 201 to perform one or more of the functions of image reconstruction system 104, such as one or more of the histo-image generation processes, the multi-view attenuation histo-image generation processes, and/or the machine learning processes described herein.

Processors 201 can store data to, and read data from, working memory 202. For example, processors 201 can store a working set of instructions to working memory 202, such as instructions loaded from instruction memory 207. Processors 201 can also use working memory 202 to store dynamic data created during the operation of computing device 200. Working memory 202 can be a random access memory (RAM) such as a static random access memory (SRAM) or dynamic random access memory (DRAM), or any other suitable memory.

Input-output devices 203 can include any suitable device that allows for data input or output. For example, input-output devices 203 can include one or more of a keyboard, a touchpad, a mouse, a stylus, a touchscreen, a physical button, a speaker, a microphone, or any other suitable input or output device.

Communication port(s) 209 can include, for example, a serial port such as a universal asynchronous receiver/transmitter (UART) connection, a Universal Serial Bus (USB) connection, or any other suitable communication port or connection. In some examples, communication port(s) 209 allows for the programming of executable instructions in instruction memory 207. In some examples, communication port(s) 209 allow for the transfer (e.g., uploading or downloading) of data, such as PET measurement data 111 and/or attenuation maps 105.

Display 206 can display user interface 205. User interface 205 can enable user interaction with computing device 200. For example, user interface 205 can be a user interface for an application that allows for the viewing of final image volumes 191. In some examples, a user can interact with user interface 205 by engaging input-output devices 203. In some examples, display 206 can be a touchscreen, where user interface 205 is displayed on the touchscreen.

Transceiver 204 allows for communication with a network, such as a Wi-Fi network, an Ethernet network, a cellular network, or any other suitable communication network. For example, if operating in a cellular network, transceiver 204 is configured to allow communications with the cellular network. Processor(s) 201 is operable to receive data from, or send data to, a network via transceiver 204.

Figure 4:
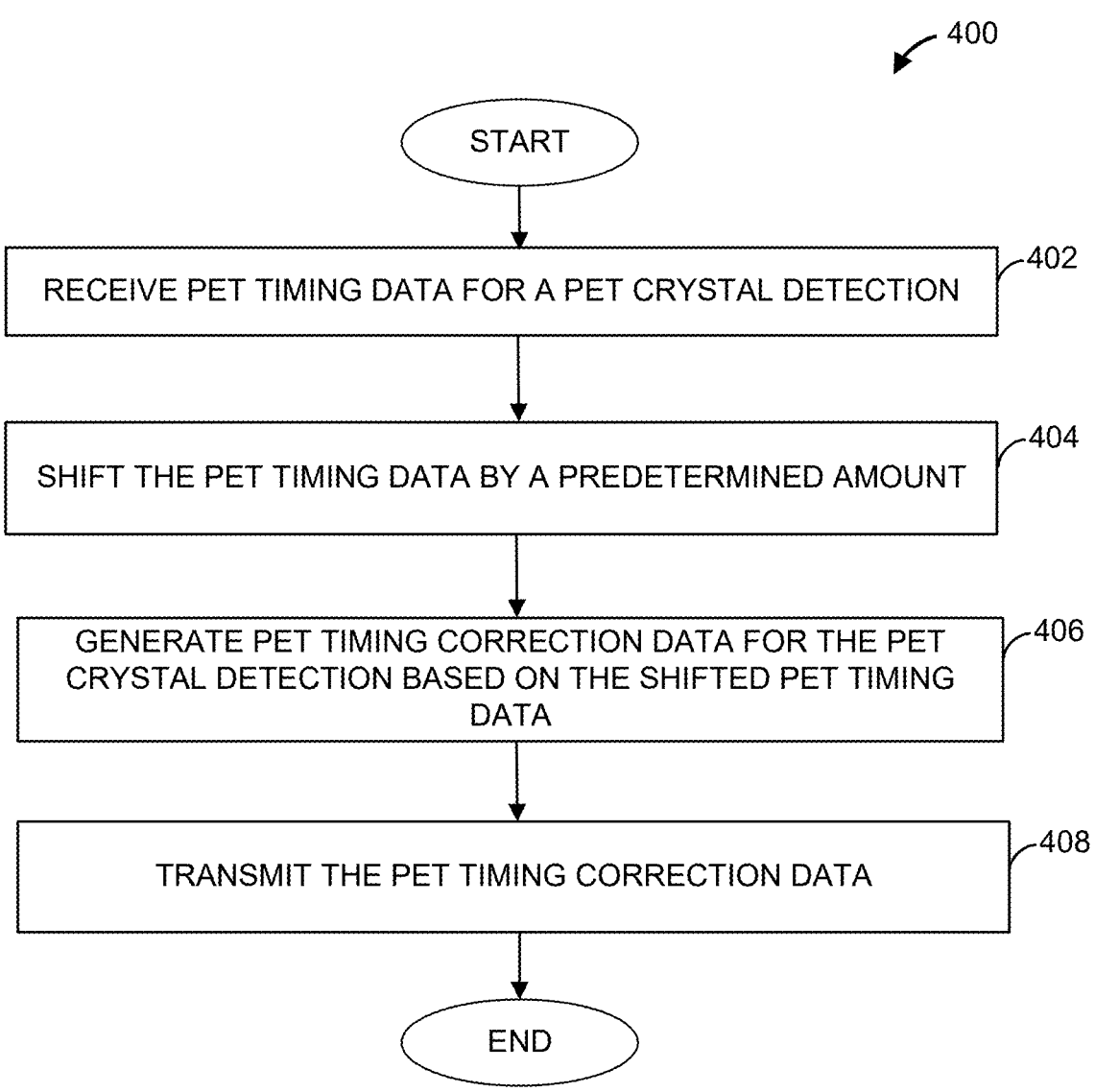
FIG. 4 is a flowchart of an example method to generate timing correction data, in accordance with some embodiments.

FIG. 4 is a flowchart of an example method 400 to generate timing correction data, such as sub-LSB TDC corrected times 155. The method can be performed by one or more computing devices, such as computing device 200, executing corresponding instructions.

Beginning at block 402, PET timing data for a PET crystal detection is received. For example, as described herein, TDC 152 may generate TDC digital time 153. Sub-LSB TDC time alignment engine 154 may receive TDC digital time 153 from TDC 152. Further, at block 404, the PET timing data is shifted by a predetermined amount (e.g., a number of bits). For instance, as described herein, sub-LSB TDC time alignment engine 154 may apply a shifting process to the TDC digital time 153 to generate shifted time 163. In some examples, the PET timing data may be shifted (e.g., shifted left) by one bit. In some examples, the PET timing data may be shifted (e.g., shifted left) by two bits. In other examples, the PET timing data may be shifted by more than two bits.

Further, and at block 406, PET timing correction data is generated for the PET crystal detection. The PET timing correction data is generated based on the shifted PET timing data. For example, as described herein, sub-LSB TDC time alignment engine 154 may apply a timing correction process to the shifted time 163 to generate sub-LSB TDC corrected time 155. The generated PET timing correction data may include timing corrections that are of a finer resolution than the corresponding time value pertaining to the LSB of the image scanning system's pulse time detection mechanism (e.g., the image scanning system's TDC). For instance, the timing corrections may account for walk, such as the signal walk described with respect to FIG. 6. At block 408, the PET timing correction data is transmitted. For example, the PET timing correction data may be transmitted for image reconstruction, as described herein.

FIG. 5 is a flowchart of an example method 500 to reconstruct an image based on timing correction data. The method can be performed by one or more computing devices, such as computing device 200, executing corresponding instructions.

Beginning at block 502, a first number of bits of PET timing data are received from a time-to-digital converter (TDC). The PET timing data is for a PET crystal detection of an event. For example, TDC 152 may generate TDC digital time 153, where TDC digital time 153 includes the first number of bits, such as 16 bits. Sub-LSB TDC time alignment engine 154 may receive the 16 bits of TDC digital time 153 from TDC 152. At block 504, a second number of bits of the PET timing data are generated based on shifting the first number of bits by a predetermined amount. For example, and as described herein, sub-LSB TDC time alignment engine 154 may apply a shifting process to the 16 bits of TDC digital time 153 to generate shifted time 163 with the second number of bits, such as 18 bits.

Proceeding to block 506, PET timing correction data is generated for the PET crystal detection based on the second number of bits of the PET timing data. For example, as described herein, sub-LSB TDC time alignment engine 154 may apply a timing correction process to the shifted time 163 to generate sub-LSB TDC corrected time 155. In some instances, sub-LSB TDC time alignment engine 154 may determine a timing correction for the particular crystal that detected the event based on a look-up table. For instance, the look-up table may identify crystals and corresponding timing correction values. A timing value for the crystal pertaining to the PET crystal detection may be added to the shifted time 163 to generate sub-LSB TDC corrected time 155. In addition, the timing correction values may include times that are of a finer resolution than the corresponding time value pertaining to the LSB of the TDC digital time 153. For example, if the shifting process applied at block 504 corresponds to a two bit shift, then the timing corrections can include values corresponding to ¼ of the corresponding time value pertaining to the LSB of the TDC digital time 153. Thus, if the LSB of the TDC digital time 153 corresponds to 62 pico-seconds, the timing corrections can include multiples of 15.6 pico-seconds (i.e., ¼ of 62 pico-seconds). As described herein, these timing corrections may account for walk, such as the signal walk described with respect to FIG. 6.

Further, at block 508, an image is reconstructed based on the PET timing correction and detection data corresponding to the PET crystal detection. For example, and as described herein, image scanning system 102 may generate time-coincident pairs based on pairs of single events that are determined to be coincident based on their time difference. The timing corrections applied at block 506 can reduce errors in the measurement of their time difference. The image scanning system 102 may generate measurement data, such as PET measurement data 111, based on these time-coincident pairs, and may transmit the measurement data to the image reconstruction system 104 to reconstruct an image, such as final image volume 191.

The following is a list of non-limiting illustrative embodiments disclosed herein:

Illustrative Embodiment 1: A computer-implemented method comprising:

- receiving first timing data for a nuclear imaging scanner event detection, the first timing data comprising a first number of bits;
- generating second timing data based on the first timing data, the second timing data comprising a second number of bits, wherein the second number of bits is greater than the first number of bits;
- generating timing correction data for the nuclear imaging scanner detection based on the second timing data; and
- storing the timing correction data within a memory device.

Illustrative Embodiment 2: The computer-implemented method of illustrative embodiment 1, wherein generating the second timing data comprises shifting the first timing data by a number of bits.

Illustrative Embodiment 3: The computer-implemented method of illustrative embodiment 2, wherein the number of bits is at least one.

Illustrative Embodiment 4: The computer-implemented method of any of illustrative embodiments 1-3, further comprising receiving the first timing data from a time-to-digital converter (TDC), the first timing data characterizing a time of detection of the nuclear imaging scanner event detection.

Illustrative Embodiment 5: The computer-implemented method of any of illustrative embodiments 1-4, further comprising receiving a signal from a scanner and, in response to the signal, detecting the nuclear imaging scanner event.

Illustrative Embodiment 6: The computer-implemented method of any of illustrative embodiments 1-5, further comprising generating image measurement data based on the timing correction data and the nuclear imaging scanner event.

Illustrative Embodiment 7: The computer-implemented method of illustrative embodiment 6, further comprising reconstructing an image based on the image measurement data.

Illustrative Embodiment 8: The computer-implemented method of any of illustrative embodiments 6-7, wherein the image measurement data is positron emission tomography (PET) measurement data.

Illustrative Embodiment 9: The computer-implemented method of any of illustrative embodiments 1-8, further comprising:

- retrieving, from the memory device, a timing correction value for the nuclear imaging scanner event; and
- generating the timing correction data based on the timing correction value.

Illustrative Embodiment 10: The computer-implemented method of illustrative embodiment 9, further comprising:

- receiving detection data for the nuclear imaging scanner event;
- determining a crystal that detected the nuclear imaging scanner event based on the detection data; and
- determining the timing correction value from a plurality of timing correction values based on the crystal.

Illustrative Embodiment 11: A non-transitory computer readable medium storing instructions that, when executed by at least one processor, cause the at least one processor to perform operations comprising:

- receiving first timing data for a nuclear imaging scanner event detection, the first timing data comprising a first number of bits;
- generating second timing data based on the first timing data, the second timing data comprising a second number of bits, wherein the second number of bits is greater than the first number of bits;
- generating timing correction data for the nuclear imaging scanner detection based on the second timing data; and
- storing the timing correction data within a memory device.

Illustrative Embodiment 12: The non-transitory computer readable medium of illustrative embodiment 11, wherein generating the second timing data comprises shifting the first timing data by a number of bits.

Illustrative Embodiment 13: The non-transitory computer readable medium of illustrative embodiment 12, wherein the number of bits is at least one.

Illustrative Embodiment 14: The non-transitory computer readable medium of any of illustrative embodiments 11-13 wherein the instructions, when executed by the at least one processor, further cause the at least one processor to perform operations comprising receiving the first timing data from a time-to-digital converter (TDC), the first timing data characterizing a time of detection of the nuclear imaging scanner event detection.

Illustrative Embodiment 15: The non-transitory computer readable medium of any of illustrative embodiments 11-14 wherein the instructions, when executed by the at least one processor, further cause the at least one processor to perform operations comprising receiving a signal from a scanner and, in response to the signal, detecting the nuclear imaging scanner event.

Illustrative Embodiment 16: The non-transitory computer readable medium of any of illustrative embodiments 11-15 wherein the instructions, when executed by the at least one processor, further cause the at least one processor to perform operations comprising generating image measurement data based on the timing correction data and the nuclear imaging scanner event.

Illustrative Embodiment 17: The non-transitory computer readable medium of illustrative embodiment 16 wherein the instructions, when executed by the at least one processor, further cause the at least one processor to perform operations comprising reconstructing an image based on the image measurement data.

Illustrative Embodiment 18: The non-transitory computer readable medium of any of illustrative embodiments 16-17, wherein the image measurement data is positron emission tomography (PET) measurement data.

Illustrative Embodiment 19: The non-transitory computer readable medium of any of illustrative embodiments 11-18 wherein the instructions, when executed by the at least one processor, further cause the at least one processor to perform operations comprising:

retrieving, from the memory device, a timing correction value for the nuclear imaging scanner event; and generating the timing correction data based on the timing correction value.

Illustrative Embodiment 20: The non-transitory computer readable medium of illustrative embodiment 19 wherein the instructions, when executed by the at least one processor, further cause the at least one processor to perform operations comprising:

receiving detection data for the nuclear imaging scanner event;

determining a crystal that detected the nuclear imaging scanner event based on the detection data; and determining the timing correction value from a plurality of timing correction values based on the crystal.

Illustrative Embodiment 21: A system comprising:

a memory device; and at least one processor communicatively coupled to the memory device and configured to:

receive first timing data for a nuclear imaging scanner event detection, the first timing data comprising a first number of bits;

generate second timing data based on the first timing data, the second timing data comprising a second number of bits, wherein the second number of bits is greater than the first number of bits;

generate timing correction data for the nuclear imaging scanner detection based on the second timing data; and store the timing correction data within the memory device.

Illustrative Embodiment 22: The system of illustrative embodiment 21, wherein generating the second timing data comprises shifting the first timing data by a number of bits.

Illustrative Embodiment 23: The system of illustrative embodiment 22, wherein the number of bits is at least one.

Illustrative Embodiment 24: The system of any of illustrative embodiments 21-23, wherein the at least one processor is configured to receive the first timing data from a time-to-digital converter (TDC), the first timing data characterizing a time of detection of the nuclear imaging scanner event detection.

Illustrative Embodiment 25: The system of any of illustrative embodiments 21-24, wherein the at least one processor is configured to receive a signal from a scanner and, in response to the signal, detecting the nuclear imaging scanner event.

Illustrative Embodiment 26: The system of any of illustrative embodiments 21-25, wherein the at least one processor is configured to generate image measurement data based on the timing correction data and the nuclear imaging scanner event.

Illustrative Embodiment 27: The system of illustrative embodiment 26, further comprising reconstructing an image based on the image measurement data.

Illustrative Embodiment 28: The system of any of illustrative embodiments 26-27, wherein the image measurement data is positron emission tomography (PET) measurement data.

Illustrative Embodiment 29: The system of any of illustrative embodiments 21-28, wherein the at least one processor is configured to:

retrieve, from the memory device, a timing correction value for the nuclear imaging scanner event; and generate the timing correction data based on the timing correction value.

Illustrative Embodiment 30: The system of illustrative embodiment 29, wherein the at least one processor is configured to:

receive detection data for the nuclear imaging scanner event;

determine a crystal that detected the nuclear imaging scanner event based on the detection data; and determine the timing correction value from a plurality of timing correction values based on the crystal.

Illustrative Embodiment 31: A system comprising:

a means for receiving first timing data for a nuclear imaging scanner event detection, the first timing data comprising a first number of bits;

a means for generating second timing data based on the first timing data, the second timing data comprising a second number of bits, wherein the second number of bits is greater than the first number of bits;

a means for generating timing correction data for the nuclear imaging scanner detection based on the second timing data; and a means for storing the timing correction data within a memory device.

Illustrative Embodiment 32: The system of illustrative embodiment 31, wherein the means for generating the second timing data comprises a means for shifting the first timing data by a number of bits.

Illustrative Embodiment 33: The system of illustrative embodiment 32, wherein the number of bits is at least one.

Illustrative Embodiment 34: The system of any of illustrative embodiments 31-33, further comprising a means for receiving the first timing data from a time-to-digital converter (TDC), the first timing data characterizing a time of detection of the nuclear imaging scanner event detection.

Illustrative Embodiment 35: The system of any of illustrative embodiments 31-34, further comprising a means for receiving a signal from a scanner and, in response to the signal, detecting the nuclear imaging scanner event.

Illustrative Embodiment 36: The system of any of illustrative embodiments 31-35, further comprising a means for generating image measurement data based on the timing correction data and the nuclear imaging scanner event.

Illustrative Embodiment 37: The system of illustrative embodiment 36, further comprising a means for reconstructing an image based on the image measurement data.

Illustrative Embodiment 38: The system of any of illustrative embodiments 36-37, wherein the image measurement data is positron emission tomography (PET) measurement data.

Illustrative Embodiment 39: The system of any of illustrative embodiments 31-38, further comprising:

a means for retrieving, from the memory device, a timing correction value for the nuclear imaging scanner event; and a means for generating the timing correction data based on the timing correction value.

Illustrative Embodiment 40: The system of illustrative embodiment 39, further comprising:

a means for receiving detection data for the nuclear imaging scanner event;

a means for determining a crystal that detected the nuclear imaging scanner event based on the detection data; and a means for determining the timing correction value from a plurality of timing correction values based on the crystal.

The apparatuses and processes are not limited to the specific embodiments described herein. In addition, components of each apparatus and each process can be practiced independent and separate from other components and processes described herein.

The previous description of embodiments is provided to enable any person skilled in the art to practice the disclosure. The various modifications to these embodiments will be readily apparent to those skilled in the art, and the generic principles defined herein can be applied to other embodiments without the use of inventive faculty. The present disclosure is not intended to be limited to the embodiments shown herein, but is to be accorded the widest scope consistent with the principles and novel features disclosed herein.

What is claimed is:

1. A computer-implemented method comprising:

receiving first timing data for a nuclear imaging scanner event detection, the first timing data comprising a first number of bits;

generating second timing data based on the first timing data, the second timing data comprising a second number of bits, wherein the second number of bits is greater than the first number of bits;

generating timing correction data for the nuclear imaging scanner event detection based on the second timing data; and storing the timing correction data within a memory device.

2. The computer-implemented method of claim 1, wherein generating the second timing data comprises shifting the first timing data by a number of bits.

3. The computer-implemented method of claim 2, wherein the number of bits is at least one.

4. The computer-implemented method of claim 1, further comprising receiving the first timing data from a time-to-digital converter (TDC), the first timing data characterizing a time of detection of the nuclear imaging scanner event detection.

5. The computer-implemented method of claim 1, further comprising receiving a signal from a scanner and, in response to the signal, detecting the nuclear imaging scanner event.

6. The computer-implemented method of claim 1, further comprising generating image measurement data based on the timing correction data and the nuclear imaging scanner event.

7. The computer-implemented method of claim 6, further comprising reconstructing an image based on the image measurement data.

8. The computer-implemented method of claim 6, wherein the image measurement data is positron emission tomography (PET) measurement data.

9. The computer-implemented method of claim 1, further comprising:

retrieving, from the memory device, a timing correction value for the nuclear imaging scanner event; and generating the timing correction data based on the timing correction value.

10. The computer-implemented method of claim 9, further comprising:

receiving detection data for the nuclear imaging scanner event;

determining a crystal that detected the nuclear imaging scanner event based on the detection data; and determining the timing correction value from a plurality of timing correction values based on the crystal.

11. A non-transitory computer readable medium storing instructions that, when executed by at least one processor, cause the at least one processor to perform operations comprising:

receiving first timing data for a nuclear imaging scanner event detection, the first timing data comprising a first number of bits;

generating second timing data based on the first timing data, the second timing data comprising a second number of bits, wherein the second number of bits is greater than the first number of bits;

generating timing correction data for the nuclear imaging scanner event detection based on the second timing data; and storing the timing correction data within a memory device.

12. The non-transitory computer readable medium of claim 11 wherein the instructions, when executed by the at least one processor, further cause the at least one processor to perform operations comprising generating the second timing data based on shifting the first timing data by a number of bits.

13. The non-transitory computer readable medium of claim 11 wherein the instructions, when executed by the at least one processor, further cause the at least one processor to perform operations comprising receiving the first timing data from a time-to-digital converter (TDC), the first timing data characterizing a time of detection of the nuclear imaging scanner event detection.

14. The non-transitory computer readable medium of claim 11 wherein the instructions, when executed by the at least one processor, further cause the at least one processor to perform operations comprising receiving a signal from a scanner and, in response to the signal, detecting the nuclear imaging scanner event.

15. The non-transitory computer readable medium of claim 11 wherein the instructions, when executed by the at least one processor, further cause the at least one processor to perform operations comprising generating image measurement data based on the timing correction data and the nuclear imaging scanner event.

16. A system comprising:

a memory device; and at least one processor communicatively coupled to the memory device and configured to:

receive first timing data for a nuclear imaging scanner event detection, the first timing data comprising a first number of bits;

generate second timing data based on the first timing data, the second timing data comprising a second number of bits, wherein the second number of bits is greater than the first number of bits;

generate timing correction data for the nuclear imaging scanner event detection based on the second timing data; and store the timing correction data within the memory device.

17. The system of claim 16, wherein the at least one processor is configured to generate the second timing data based on shifting the first timing data by a number of bits.

18. The system of claim 16, wherein the at least one processor is configured to receive the first timing data from a time-to-digital converter (TDC), the first timing data characterizing a time of detection of the nuclear imaging scanner event detection.

19. The system of claim 16, wherein the at least one processor is configured to receive a signal from a scanner and, in response to the signal, detecting the nuclear imaging scanner event.

20. The system of claim 16, wherein the at least one processor is configured to generate image measurement data based on the timing correction data and the nuclear imaging scanner event.

\* \* \* \* \*